(12) United States Patent
Okada

(10) Patent No.: US 7,164,464 B2
(45) Date of Patent: Jan. 16, 2007

(54) EXPOSURE APPARATUS AND ABERRATION CORRECTION METHOD

(75) Inventor: Yoshiyuki Okada, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 11/201,426

(22) Filed: Aug. 11, 2005

(65) Prior Publication Data

US 2006/0017898 A1   Jan. 26, 2006

Related U.S. Application Data

(62) Division of application No. 10/791,821, filed on Mar. 4, 2004, now Pat. No. 6,995,828.

(30) Foreign Application Priority Data

Mar. 14, 2003   (JP)   ............... 2003-070594

(51) Int. Cl.
 G03B 27/42   (2006.01)
 G03B 27/68   (2006.01)
 G03B 27/52   (2006.01)

(52) U.S. Cl. ............... 355/53; 355/52; 355/55
(58) Field of Classification Search ............... 355/44, 355/52, 53, 55, 67–71, 30; 430/30
 See application file for complete search history.

(56) References Cited

U.S. PATENT DOCUMENTS

| | | | |
|---|---|---|---|
| 4,666,273 A * | 5/1987 | Shimizu et al. ............ 353/101 |
| 5,025,284 A * | 6/1991 | Komoriya et al. ............ 355/53 |
| 5,095,190 A * | 3/1992 | Aketagawa et al. ... 219/121.78 |
| 5,270,771 A * | 12/1993 | Sato ............... 355/53 |
| 5,838,426 A | 11/1998 | Shinonaga et al. ........... 355/52 |
| 6,614,503 B1 | 9/2003 | Uzawa ............... 355/30 |
| 6,646,713 B1 * | 11/2003 | Ishii ............... 355/30 |
| 6,795,161 B1 | 9/2004 | Ogura et al. ............... 355/30 |
| 2002/0085184 A1 | 7/2002 | Amano ............... 355/30 |
| 2002/0089654 A1 * | 7/2002 | Ota et al. ............... 355/67 |
| 2003/0020888 A1 * | 1/2003 | Tanaka et al. ............... 355/30 |
| 2004/0105085 A1 | 6/2004 | Suzuki ............... 355/69 |

FOREIGN PATENT DOCUMENTS

| | | |
|---|---|---|
| JP | 8-305034 | 11/1996 |
| JP | 2001-85292 | 3/2001 |

* cited by examiner

Primary Examiner—Rodney Fuller
Assistant Examiner—Kevin Gutierrez
(74) Attorney, Agent, or Firm—Fitzpatrick, Cella, Harper & Scinto

(57) ABSTRACT

An exposure apparatus includes a barometer for detecting air pressure, a lens driving unit for driving a lens of a projection optical system, a light-source-wavelength changing unit for changing a wavelength of an exposure light source, and a stage driving unit for driving a wafer stage in an optical-axis direction. The apparatus can correct an aberration caused by a change in air pressure by utilizing the lens driving unit, the light-source-wavelength changing unit, and the stage driving unit. During a shot of an exposure of the exposure apparatus, the lens driving unit and/or the stage driving unit are employed to correct the aberration. In the non-exposure state (shot interval), the light-source-wavelength changing unit and/or the lens driving unit as well as the stage driving unit are employed to correct the aberration.

5 Claims, 11 Drawing Sheets

FIG. 3A [AIR PRESSURE]

FIG. 3B [EXPOSURE]

FIG. 3C [SHOT-INTERVAL CORRECTION]

FIG. 3D [REAL-TIME CORRECTION]

FIG. 3E [DATA HOLDING UNIT]

F I G. 10
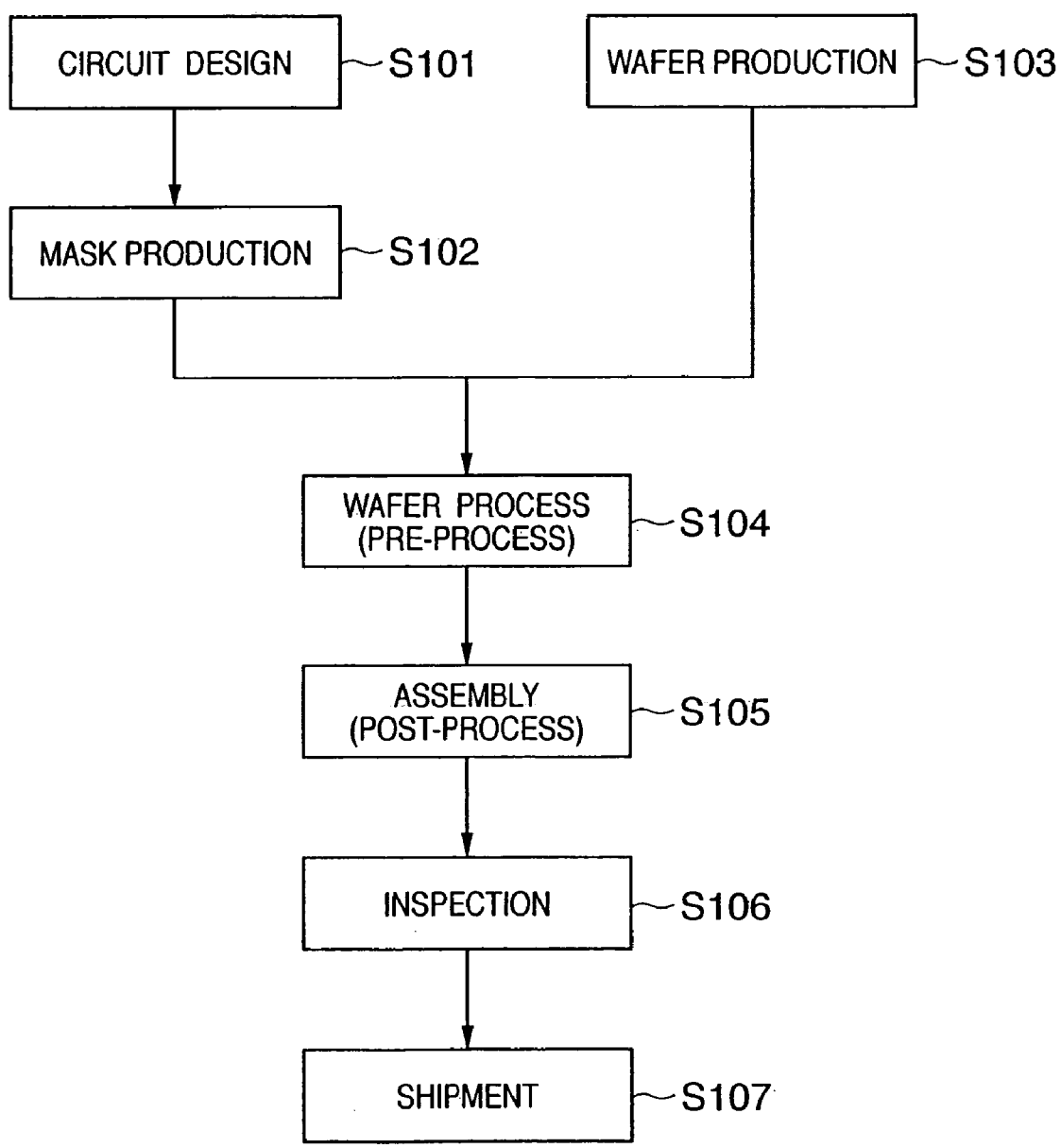

EXPOSURE APPARATUS AND ABERRATION CORRECTION METHOD

This application is a divisional application of copending U.S. patent application Ser. No. 10/791,821, filed Mar. 4, 2004 now U.S. patent No. 6,995,828.

FIELD OF THE INVENTION

The present invention relates to a technique of correcting an aberration of a projection optical system, which is caused by a change in air pressure, thereby enabling exposure processing with high precision, and more particularly, the invention is preferably applied to a semiconductor exposure apparatus and a device manufacturing apparatus.

BACKGROUND OF THE INVENTION

When air pressure changes in a semiconductor exposure apparatus, an aberration, which is an optical characteristic error, is generated. A correction method of an aberration caused by a daily moderate change in air pressure is disclosed in, e.g., Japanese Patent Application Laid-Open No. 8-305034. According to Japanese Patent Application Laid-Open No. 8-305034, a projection optical system mainly configured with a single glass material measures air pressure for each wafer and corrects an aberration by changing the wavelength of an exposure light source in accordance with the change in air pressure, and to correct a magnification difference between processes, drives a projection lens in the optical-axis direction, thereby performing projection magnification correction.

Along with further miniaturization of patterns for the recent semiconductor integrated circuits, such as an IC or LSI, higher precision of image forming characteristics in exposure is required. For this reason, even a slight change in air pressure is difficult to tolerate. For instance, Japanese Patent Application Laid-Open No. 2001-085292 discloses a correction method of an aberration caused by a slight but sudden change in air pressure due to human factors, or the like, under the environment where an exposure apparatus is installed. According to Japanese Patent Application Laid-Open No. 2001-085292, since there is a case that opening and closing a door to a clean room causes a change in the air pressure of approximately 0.5 hPa/sec, the change in air pressure is detected by a barometer employing a responsive laser interferometer, and a projection lens is driven in an optical-axis direction to correct an aberration caused by the detected change in air pressure, or a wavelength of the exposure light source is changed to correct an aberration caused by the detected change in air pressure.

In general, an aberration caused by a change in air pressure is extremely large in the projection magnification and focus, thus requiring reduction by correction. On the contrary, aberrations such as distortion, spherical aberration, coma, astigmatism, curvature of field, and the like, are relatively small so that they do not create problems in terms of exposure characteristics.

However, the aforementioned Japanese Patent Application Laid-Open No. 8-305034 does not include means for correcting an aberration caused by a change in air pressure during an exposure. Further, it does not take aberration correction means into consideration for a case where the projection optical system is not configured with a single glass material. Moreover, in the aforementioned Japanese Patent Application Laid-Open No. 2001-085292, which discloses a correction method using a barometer that employs a responsive laser interferometer, there is a possibility that accurate aberration correction cannot be performed because a barometer employing a laser interferometer generates an air pressure error due to changes in environmental conditions of temperature and humidity.

SUMMARY OF THE INVENTION

The present invention has been proposed in view of the above-described problems, and has as its object to correct an aberration in an optical system caused by a slight or sudden change in air pressure, thereby enabling highly precise exposure processing.

In order to attain the above-described object, an exposure apparatus according to the present invention has the following configuration. More specifically, there is provided an exposure apparatus comprising: air pressure measurement means for measuring air pressure in a neighborhood of or inside a projection optical system; first correction means, including aberration adjustment by driving a lens of the projection optical system, for repeatedly executing correction of an aberration based on the air pressure which is measured by the air pressure measurement means; and second correction means, including aberration adjustment by changing a wavelength of an exposure light source, for executing correction of an aberration at a time interval longer than a repetition of the aberration correction executed by the first correction means, based on the air pressure which is measured by the air pressure measurement means.

Furthermore, in order to attain the above-described object, an exposure apparatus according to another aspect of the present invention has the following configuration. More specifically, there is provided an exposure apparatus comprising: a first barometer for detecting an absolute value of air pressure; a second barometer for detecting an absolute value or a relative value of air pressure at a higher speed than the first barometer; calibration means for calibrating an output of the second barometer based on an output of the first barometer, and outputting a calibration result as a measured air pressure value; and aberration correction means for performing aberration correction based on the air pressure value outputted by the calibration means.

Furthermore, in order to attain the above-described object, an aberration correction method according to the present invention is an aberration correction method for correcting an aberration based on an air pressure value measured by air pressure measurement means that measures air pressure in a neighborhood of or inside a projection optical system, the method comprising: a first correction step of repeatedly executing correction of a predetermined number of aberrations based on the air pressure value which is measured by the air pressure measurement means, the step including aberration adjustment by driving a lens of the projection optical system; and a second correction step of executing aberration correction at a time interval longer than a repetition of the aberration correction executed in the first correction step, based on the air pressure which is measured by the air pressure measurement means, the step including aberration adjustment by changing a wavelength of an exposure light source.

Furthermore, in order to attain the above-described object, an aberration correction method according to another aspect of the present invention is a method of correcting an aberration caused by a change in air pressure in an exposure apparatus, comprising: a calibration step of calibrating an output of a second barometer based on an output of a first barometer and outputting a calibration result as a measured air pressure value, the first barometer detecting an absolute value of air pressure and the second barometer detecting an absolute value or a relative value of air pressure at a higher speed than the first barometer; and an aberration correction step of performing aberration correction based on the air pressure value outputted in the calibration step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 10 is a flowchart describing a semiconductor device manufacturing process.

DETAILED DESCRIPTION OF THE PREFERRED EMBODIMENTS

Preferred embodiments of the present invention will now be described in detail in accordance with the accompanying drawings.

<First Embodiment>

Figure 1:
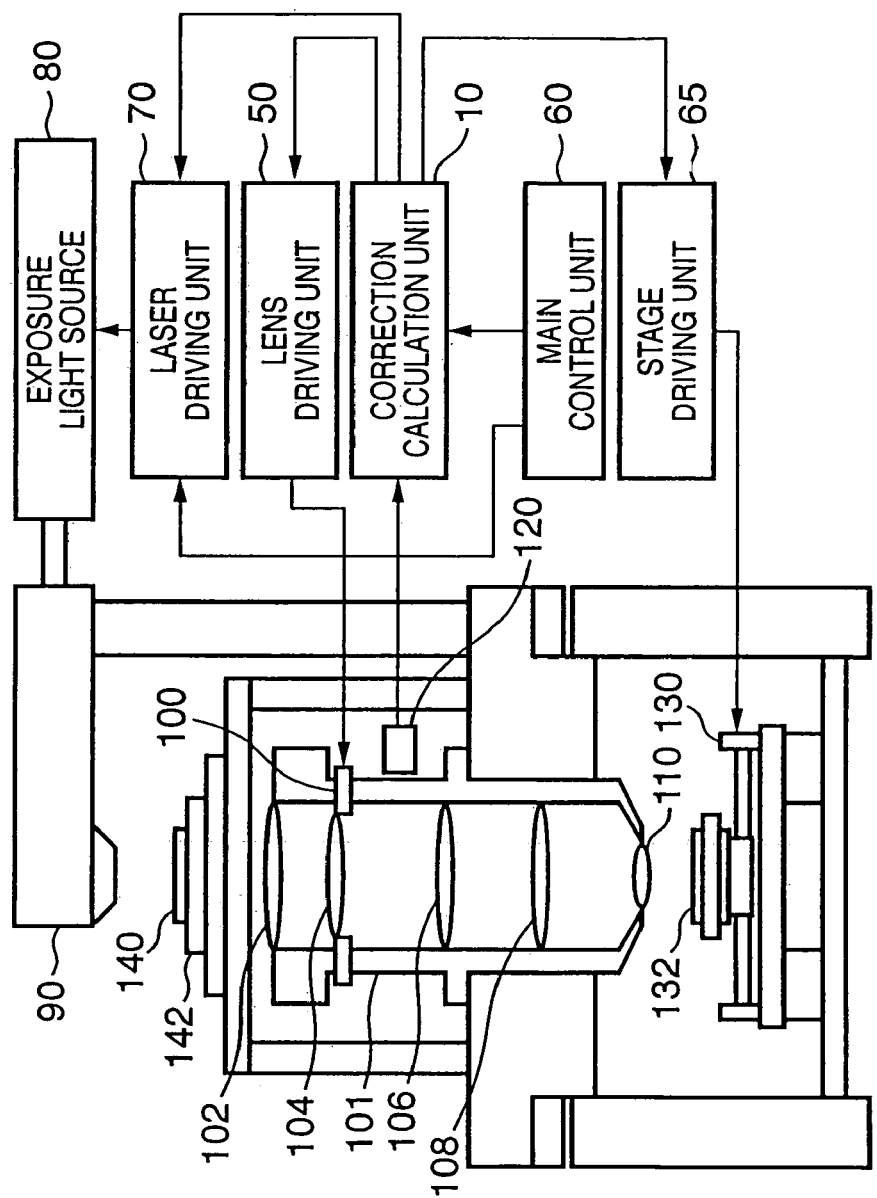
FIG. 1 is a view showing a configuration of an exposure apparatus according to a first embodiment of the present invention.

FIG. 1 shows a configuration of an exposure apparatus according to the first embodiment. Referring to FIG. 1, an illumination optical system 90 irradiates exposure light emitted from an exposure light source 80 to a reticle 140 placed on a reticle stage 142. The exposure light, transmitted through the reticle 140, transmits through the lenses 102, 104, 106, 108 and 110 of a projection optical system 101, and reaches a wafer 132 placed on a wafer stage 130. In the foregoing manner, micropatterns rendered on the reticle 140 are exposed into respective chips on the wafer 132. Note, although this embodiment shows five lenses as the lenses, an exposure apparatus normally comprises twenty to thirty lenses.

For the exposure light source 80, a KrF or an ArF laser light source is often used. The exposure light source 80 and illumination optical system 90 can be expressed by a simplified structure shown in FIG. 9.

Figure 9:
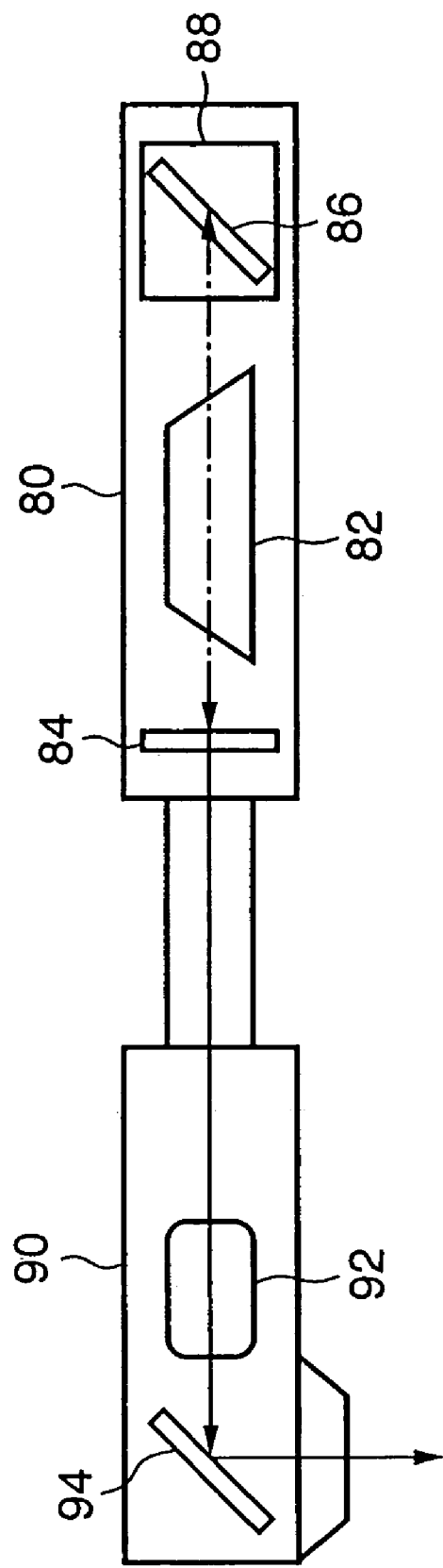
FIG. 9 is a block diagram showing, as an example, a construction of an illumination optical system and an exposure light source according to the first embodiment.

The exposure light source 80 and illumination optical system 90 are described with reference to FIG. 9. The exposure light source 80 comprises a laser resonator 82, a transmitting mirror 84, a wavelength selecting element 86, and a wavelength selecting element driving mechanism 88. With the use of at least one of a prism, a grating, and an etalon as the wavelength selecting element 86, the wavelength band can be narrowed. By changing an angle of the wavelength selecting element 86 using the wavelength selecting element driving mechanism 88, the wavelength of a laser beam can be changed. The wavelength selecting element driving mechanism 88 can be configured with a step motor, a piezoelectric device, or the like. The laser beam emitted from the exposure light source 80 transmits through a condensing lens 92 of the illumination optical system 90, and thereafter, the mirror 94 leads the laser beam to irradiate the reticle.

The description continues referring back to FIG. 1. A laser driving unit 70 can change the wavelength of a laser beam of the exposure light source 80 by driving the wavelength selecting element driving mechanism 88 shown in FIG. 9. A lens driving unit 50 displaces the lens 104 with respect to the optical axis direction by driving a lens driving mechanism 100. The lens driving mechanism 100 can be configured with an actuator employing air pressure, or a piezoelectric device, or the like. Note, although the first embodiment shows only one system of a lens driving mechanism, a plurality of lens driving mechanisms may be included.

The entire exposure apparatus is controlled by a main control unit 60. The wafer stage 130 is driven by the stage driving unit 65 to perform step-and-repeat or step-and-scan driving.

A barometer 120 measures air pressure in the exposure apparatus. The barometer 120 may be arranged in any place of the exposure apparatus, or in the neighborhood of the projection optical system 101, or in the internal portion of the projection optical system 101. An output signal of the barometer 120 is inputted to a correction calculation unit 10. Based on the measurement value inputted by the barometer 120, the correction calculation unit 10 instructs the laser driving unit 70 to change the wavelength of the laser beam, instructs the lens driving unit 50 to drive the lens in the optical axis direction, and instructs the stage driving unit 65 to drive the stage in the Z direction, thereby correcting an aberration caused by a change in air pressure.

Next, a construction and operation of the correction calculation unit 10 is described with reference to FIGS. 2 and 3A to 3E.

Figure 2:
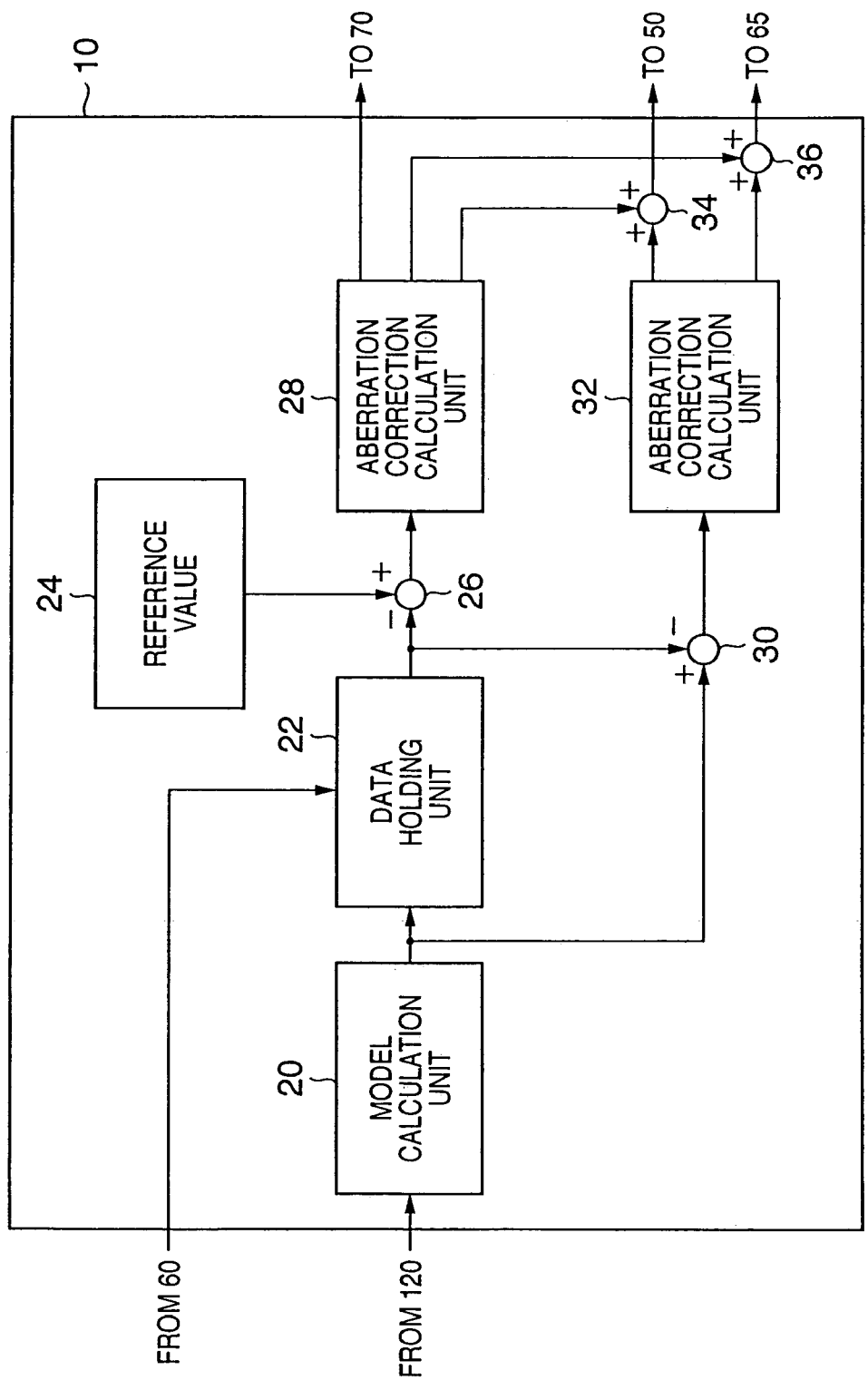
FIG. 2 is a block diagram showing, as an example, a construction of a correction calculation unit according to the first embodiment.

FIG. 2 shows a construction of the correction calculation unit 10. A model calculation unit 20 compensates for a response error between the air pressure data measured by the barometer 120 and ambient pressure of the lenses 102, 104, 106, 108 and 110 in the projection optical system 101. In general, the ambient pressure of the lenses in the projection optical system has a primary delay characteristic in response to a change in air pressure in the exposure apparatus. For this reason, in a case where the barometer 120 is arranged in the external portion of the projection optical system, an air pressure characteristic of the barometer 120 and ambient pressure characteristics of the lenses are measured in advance and a model is generated. The model calculation unit 20 refers to this model to compensate for the measured value of the barometer 120, and obtains ambient pressure of the lenses. In a case where the barometer 120 is arranged in the internal portion of the projection optical system, the model calculation unit 20 can be omitted since a response error is small. Note that if the barometer 120 has a large detection noise, smoothing such as filtering, or the like, may be performed as needed.

A data holding unit 22 holds a signal from the model calculation unit 20 in accordance with a timing signal from the main control unit 60. It is preferable to use the timing signal immediately after an end of exposure. This operation is described with reference to FIGS. 3A to 3E.

Figure 3:
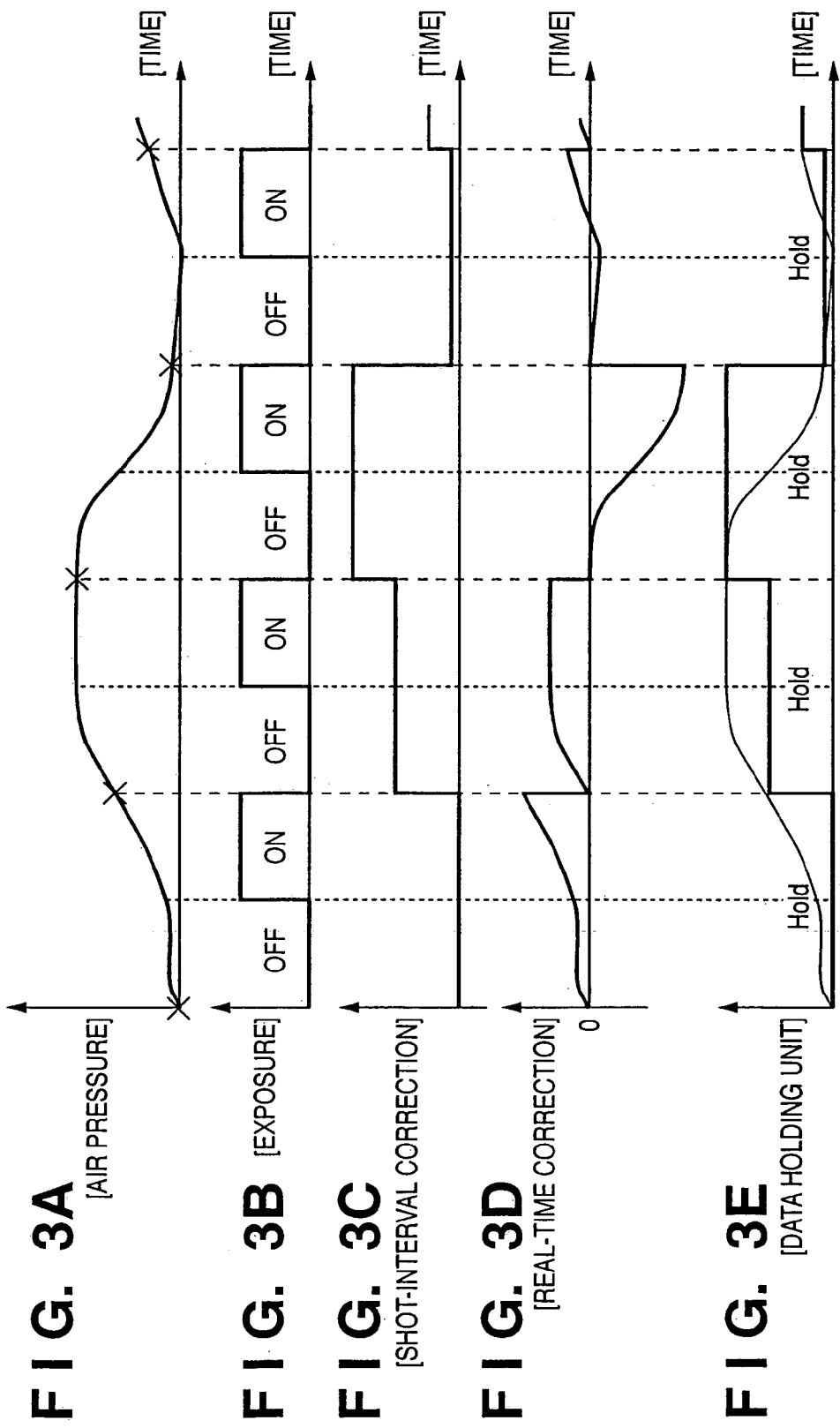
FIGS. 3A to 3E are timing charts of aberration correction according to the first embodiment.

FIGS. 3A to 3E are timing charts showing an operation of the correction calculation unit 10. FIG. 3A shows air pressure data detected by the barometer 120. In a case wherein the model calculation unit 20 has performed a compensation calculation of a response error, an output of the model calculation unit 20 is adopted. FIG. 3B shows ON/OFF of an exposure, i.e., a shot. For aberration correction in the non-exposure state, air pressure data after an exposure is completed and OFF is used. As mentioned above, it is preferable to use air pressure data immediately after an end of exposure (mark X in FIG. 3A). FIG. 3E shows how air pressure data is held by the data holding unit 22. In accordance with a timing signal from the main control unit 60 shown in FIG. 2, air pressure data immediately after an end of exposure is held. FIG. 3D will be described later in detail.

The description of the operation of the correction calculation unit 10 continues referring back to FIG. 2. The air pressure data immediately after an end of exposure, which has been held by the data holding unit 22, is compared with an air pressure reference value 24 by an adder-substracter 26 to calculate a difference. The difference is inputted to an aberration correction calculation unit 28. The aberration calculation unit 28 calculates a lens driving amount and a light-source-wavelength changing amount necessary for correcting an aberration based on the air pressure difference data from the adder-substracter 26, which is updated immediately after an end of exposure.

In general, an aberration caused by a change in air pressure is extremely large in the projection magnification and focus, thus requiring induction by correction. On the contrary, aberrations such as distortion, spherical aberration, coma, astigmatism, curvature of field, and the like, are relatively small so that they do not create problems in the exposure characteristics.

An aberration can be changed by optically designing the lenses of the projection optical system in a way that the direction of the lenses is changed in the optical-axis direction. Normally, it is often the case that the optical system is designed in a way that one of the lenses is displaced with respect to the optical-axis direction by a lens driving mechanism so as to largely change an aberration. For instance, the optical system is designed so that the lens 104 is displaced with respect to the optical axis direction by the lens driving mechanism 100 to change the projection magnification. Note, when the projection magnification is changed, there is a possibility that other aberrations such as distortion, spherical aberration, coma, astigmatism, curvature of field, and the like, may slightly change. If this does not constitute a matter of concern for precision, it may be ignored. However, if it creates a problem, the aberrations must be reduced by displacing other lenses with respect to the optical-axis direction using the lens driving mechanism. Therefore, the optical system is generally designed so that n number of aberrations can be corrected by displacing n groups of lenses with respect to the optical-axis direction. Meanwhile, each aberration changes in accordance with a change in the wavelength of exposure light. Since the sensitivity of aberrations in response to a change in the wavelength differs depending on the lens design, it cannot generally be defined. However, there is an aberration that largely changes in accordance with the wavelength change, and an aberration that changes only slightly.

In the case of correcting aberrations by displacing n groups of lenses with respect to the optical-axis direction as described above and by changing the wavelength of exposure light, it is possible to correct n+1 number of aberrations.

Assume a case of correcting four aberrations, i.e., projection magnification, distortion, coma, and curvature of field, by driving three groups of lenses and changing the wavelength of exposure light. Normally, the optical design is made so that each aberration caused by a change in air pressure is linear with respect to air pressure. Therefore, assume that each aberration changes linearly to a change in air pressure, and that respective aberrations have the following air pressure sensitivity: projection magnification sensitivity $\delta Mag$, distortion $\delta Dist$, coma $\delta Cm$, and curvature of field $\delta Fc$. If air pressure changes by $\Delta P$ from a reference value, the aberrations caused by the change in air pressure are predicted to be $\Delta Mag$, $\Delta Dist$, $\Delta Cm$ and $\Delta \delta Fc$ according to the following equation (1). Define that the respective driving amounts of the three groups of lenses and the amount of change in the exposure light wavelength necessary for correcting these aberrations are $\Delta L1$, $\Delta L2$, $\Delta L3$, and $\Delta \lambda$, and that the aberration sensitivity in response to the respective lens driving and the wavelength change is expressed by matrix A having four rows and four columns. Based on the matrix calculation of equations (2) and (3), the respective driving amounts $\Delta L1$, $\Delta L2$, $\Delta L3$ and $\Delta \lambda$ necessary for correcting the aberrations caused by the change in air pressure can be calculated by solving the matrix calculation of equation (4). Herein, $A^{-1}$ is an inverse matrix of matrix A having four rows and four columns.

$$\begin{bmatrix} \Delta Mag \\ \Delta Dist \\ \Delta Cm \\ \Delta Fc \end{bmatrix} = \begin{bmatrix} \delta Mag \\ \delta Dist \\ \delta Cm \\ \delta Fc \end{bmatrix} \Delta P \qquad (1)$$

$$\begin{bmatrix} Mag1 & Mag2 & Mag3 & Mag4 \\ Dist1 & Dist2 & Dist3 & Dist4 \\ Cm1 & Cm2 & Cm3 & Cm4 \\ Fc1 & Fc2 & Fc3 & Fc4 \end{bmatrix} \begin{bmatrix} \Delta L1 \\ \Delta L2 \\ \Delta L3 \\ \Delta \lambda \end{bmatrix} = \begin{bmatrix} \Delta Mag \\ \Delta Dist \\ \Delta Cm \\ \Delta Fc \end{bmatrix} \qquad (2)$$

$$A = \begin{bmatrix} Mag1 & Mag2 & Mag3 & Mag4 \\ Dist1 & Dist2 & Dist3 & Dist4 \\ Cm1 & Cm2 & Cm3 & Cm4 \\ Fc1 & Fc2 & Fc3 & Fc4 \end{bmatrix} \qquad (3)$$

$$\begin{bmatrix} \Delta L1 \\ \Delta L2 \\ \Delta L3 \\ \Delta \lambda \end{bmatrix} = A^{-1} \begin{bmatrix} \Delta Mag \\ \Delta Dist \\ \Delta Cm \\ \Delta Fc \end{bmatrix} \qquad (4)$$

Based on the air pressure difference data repeatedly outputted from the adder-subtracter 36 immediately after an end of exposure, the aberration correction calculation unit 28 predicts an aberration caused by the change in air pressure using equation (1), and calculates by equation (4) the lens driving amount and the exposure-light-wavelength changing amount necessary for correcting the aberration. The calculated lens driving amount is inputted to an adder 34, and outputted to the lens driving unit 50. In accordance with the lens driving amount, the lens driving unit 50 displaces the lens with respect to the optical-axis direction using the lens driving mechanism unit. The exposure-light-wavelength changing amount calculated by the aberration correction calculation unit 28 is inputted to the laser driving unit 70. In accordance with the inputted wavelength changing amount, the laser driving unit 70 changes the wavelength of exposure light using the wavelength selecting element driving mechanism 88 of the exposure light source 80. In the foregoing manner, n+1 number of aberrations can be corrected by driving n groups of lenses and changing the wavelength of exposure light.

Note that focus can be corrected by driving the wafer stage 130 in the optical-axis direction. Correction using the wafer stage 130 is realized in the following manner. First, a focus error caused by a change in air pressure, as well as a focus error caused by the aforementioned lens driving or wavelength change, are calculated separately by the aberration correction calculation unit 28 to obtain the wafer stage driving amount for focus correction. The wafer stage driving amount is inputted to the adder 36, and outputted to the stage driving unit 65. The stage driving unit 65 displaces the wafer stage 130 with respect to the optical-axis direction, thereby correcting the focus. Aberration correction executed by driving the wafer stage in the optical-axis direction in addition to the aforementioned aberration correction executed by driving n groups of lenses and changing the exposure-light wavelength can realize correction of n+2 aberrations.

As described above, the aberration correction calculation unit 28 calculates the lens driving amount and the exposure-light-wavelength changing amount (as well as the wafer stage driving amount in the optical axis direction) necessary for correcting an aberration caused by a change in air pressure each time an exposure ends. Based on the driving amounts, correction is performed at the timing shown in FIG. 3C. This will be referred to as a shot-interval correction. The shot-interval correction is performed between shots based on air pressure data immediately after an end of exposure.

Note that in a case wherein the lenses of the projection optical system are configured with a single glass material, all aberrations can be corrected by changing the wavelength of exposure light. In this case, the aberration correction calculation unit 28 calculates the wavelength changing amount based on the air pressure difference data, which is repeatedly outputted from the adder-subtracter 26 immediately after an end of exposure, using an equation linearly approximated for an optical design purpose which expresses a characteristic of the exposure-light-wavelength changing amount in response to a change in air pressure from a reference air pressure. The wavelength changing amount is inputted to the laser driving unit 70, and the wavelength of exposure light is changed using the wavelength selecting element driving mechanism 88 of the exposure light source 80, thereby correcting an aberration caused by a change in air pressure. In this case, the shot-interval correction is performed only for changing the wavelength of exposure light, and it is not necessary to drive the lens or wafer stage in the optical-axis direction.

Next, real-time correction of a change in air pressure during an exposure is described.

As shown in FIG. 3A, air pressure is constantly changing, and a slight or sudden change in air pressure may occur due to human factors or the like. For instance, opening and closing of a door to a clean room can cause a change in the air pressure of approximately 0.5 hPa/sec. Although the above-described shot interval correction can correct an aberration caused by a change in air pressure, if air pressure changes during an exposure as shown in FIG. 3A, an aberration will occur, making it unable to perform highly precise exposure. Therefore, the correction calculation unit 10 according to this embodiment performs real-time correction in accordance with a change in air pressure during an exposure (during a shot).

In the correction calculation unit 10 shown in FIG. 2, the output of the data holding unit 22 is inputted to the adder-subtracter 26, as well as the adder-subtracter 30. In the adder-subtracter 30, the output from the data holding unit 22 is compared with the air pressure data from the model calculation unit 20, and an air pressure difference value is outputted. The air pressure difference value, representing a change in air pressure after the shot-interval correction, is inputted moment to moment, i.e., in real time, to an aberration correction calculation unit 32 as shown in FIG. 3D. Note that in this embodiment, other factors such as the wavelength of the exposure light source are adjusted in the non-exposure state, thereby returning the lens driving position for aberration correction to the neutral position. Accordingly, the lens driving amount for aberration correction is reset in the non-exposure state, and an integration value of the lens driving amount is suppressed. By virtue of this, correction of an aberration caused by a change in air pressure can be realized with a small lens driving range, enabling simplification and downsizing/weight-saving of the lens driving mechanism.

The aberration correction calculation unit 32 calculates a lens driving amount for correcting m number of aberrations by displacing m groups of lenses with respect to the optical-axis direction. Note that m is the number of the group larger than 1, and is smaller than the n group which is used in the shot-interval correction.

Assume a case of correcting three aberrations, i.e., projection magnification, distortion, and coma by driving m=3 groups of lenses. If a change in air pressure which is inputted to the aberration correction calculation unit 32 is $\Delta P_{-RT}$, the aberrations caused by the change in air pressure are predicted to be $\Delta Mag_{RT}$, $\Delta Dist_{RT}$, and $\Delta Cm_{RT}$ according to the following equation (5). Define that the respective driving amounts of three groups of lenses necessary for correcting these aberrations are expressed by $\Delta L1_{RT}$, $\Delta L2_{RT}$, and $\Delta L3_{RT}$, and that the aberration sensitivity in response to the respective lens driving is expressed by a matrix $A_{RT}$ having three rows and three columns. Based on the matrix calculation of equations (6) and (7), the respective driving amounts $\Delta L1_{RT}$, $\Delta L2_{RT}$, and $\Delta L3_{RT}$ necessary for correcting the aberrations caused by the change in air pressure can be calculated by solving the matrix calculation of equation (8). Herein, $A_{RT}^{-1}$ is an inverse matrix of matrix $A_{RT}$ having three rows and three columns.

$$\begin{bmatrix} \Delta Mag_{RT} \\ \Delta Dist_{RT} \\ \Delta Cm_{RT} \end{bmatrix} = \begin{bmatrix} \delta Mag \\ \delta Dist \\ \delta Cm \end{bmatrix} \Delta P_{RT} \qquad (5)$$

$$\begin{bmatrix} Mag1 & Mag2 & Mag3 \\ Dist1 & Dist2 & Dist3 \\ Cm1 & Cm2 & Cm3 \end{bmatrix} \begin{bmatrix} \Delta L1_{RT} \\ \Delta L2_{RT} \\ \Delta L3_{RT} \end{bmatrix} = \begin{bmatrix} \Delta Mag_{RT} \\ \Delta Dist_{RT} \\ \Delta Cm_{RT} \end{bmatrix} \qquad (6)$$

$$A_{RT} = \begin{bmatrix} Mag1 & Mag2 & Mag3 \\ Dist1 & Dist2 & Dist3 \\ Cm1 & Cm2 & Cm3 \end{bmatrix} \qquad (7)$$

$$\begin{bmatrix} \Delta L1_{RT} \\ \Delta L2_{RT} \\ \Delta L3_{RT} \end{bmatrix} = A_{RT}^{-1} \begin{bmatrix} \Delta Mag_{RT} \\ \Delta Dist_{RT} \\ \Delta Cm_{RT} \end{bmatrix} \qquad (8)$$

As described above, the aberration correction calculation unit 32 receives in real time from the adder-subtracter 30 the air-pressure-change data which has been subjected to shot-interval correction, i.e., air pressure difference value. Based on the air pressure different data outputted in real time (in this embodiment, a change in air pressure from the end of the previous shot), the aberration correction calculation unit 32 predicts in real time an aberration caused by the change in air pressure using equation (5), and calculates in real time by equation (8) the lens driving amount necessary for correcting the aberration. The calculated lens driving amount is inputted to the adder 34 for adding the lens driving amount on which the above-described shot-interval correction has been performed, and outputted to the lens driving unit 50. The lens driving unit 50 displaces the lens in real time with respect to the optical-axis direction using the lens driving mechanism unit, thereby correcting in real time the aberration caused by the change in air pressure.

Note that focus can be corrected by driving the wafer stage in the optical-axis direction. Therefore, the wafer stage 130 may be constructed such that it is displaced with respect to the optical-axis direction to correct the focus. In this case, a focus error caused by a change in air pressure, as well as a focus error caused by the aforementioned lens driving, are calculated separately by the aberration correction calculation unit 32 to obtain the wafer stage driving amount for focus correction in real time. The wafer stage driving amount is inputted to the adder 36 for adding a focus correction signal (correction signal for a shot interval) from the aberration correction calculation unit 28, and outputted to the stage driving unit 65. The stage driving unit 65 displaces the wafer stage 130 with respect to the optical-axis direction, thereby correcting the focus.

Note that in this case, driving m groups of lenses and driving the wafer stage in the optical-axis direction can realize correction of m+1 aberrations. Assuming that m=n groups, n+1 aberrations can be corrected in real time.

As described above, the aberration correction calculation unit 32 calculates the lens driving amount (as well as the wafer stage driving amount in the optical-axis direction) necessary for correcting an aberration caused by a change in air pressure during an exposure. Based on the driving amount, aberrations caused by a change in air pressure during an exposure can be corrected at the timing shown in FIG. 3D. This will be referred to as a real-time correction. In the above-described manner, according to the first embodiment, aberrations are corrected by shot-interval correction immediately after an end of exposure, and aberrations caused by a change in air pressure between shots are corrected by real-time correction.

As has been set forth above, according to the first embodiment, in a case wherein the lenses of the projection optical system are not configured with a single glass material, driving the n groups of lenses and driving the light-source wavelength, as well as the wafer stage in the optical-axis direction, can correct aberrations caused by a change in air pressure. During a shot interval, n+2 aberrations can be corrected, and during a shot, n+1 aberrations can be corrected in real time. On the contrary, in a case wherein the lenses of the projection optical system are configured with a single glass material, driving the n groups of lenses and driving the light-source wavelength, as well as the wafer stage in the optical-axis direction, can correct aberrations caused by a change in air pressure. During a shot interval, all the aberrations can be corrected by changing the exposure-light wavelength, and during a shot, n+1 aberrations can be corrected in real time by driving the n groups of lenses and driving the wafer stage in the optical-axis direction.

Accordingly, either the case where the lenses of the projection optical system are configured with a single glass material or the case where the lenses are not configured with a single glass material, it is possible to correct in real time an aberration caused by a slight or sudden change in air pressure during an exposure or in the non-exposure state. As a result, it is possible to achieve an exposure apparatus capable of performing exposure with high precision.

<Second Embodiment>

Next, the second embodiment is described. In the first embodiment, the aberration correction operation is switched during a shot interval and during a shot. In the second embodiment, an aberration correction operation is switched for performing the correction at long time intervals and for performing the correction at short time intervals.

In the following second embodiment, aberration correction at short time intervals corrects an aberration by driving the lens in the optical-axis direction, and aberration correction at long time intervals corrects an aberration by changing the exposure-light wavelength, or by driving the lens in the optical-axis direction and changing the exposure-light wavelength. Herein, the aberration correction at short time intervals is repeatedly executed during an exposure and in the non-exposure state of the wafer exposure process, and the aberration correction at long time intervals is executed when wafer exchange processing is performed.

The construction of the correction calculation unit 10 according to the second embodiment is identical to that of the first embodiment (FIG. 2). However, in the second embodiment, the timing signal outputted from the main control unit 60 is different.

More specifically, the timing signal from the main control unit 60 to the data holding unit 22 in FIG. 2 is outputted after all the exposure processing for one wafer is completed. In this timing, the signal from the model calculation unit 20 is held by the data holding unit 22. When the wafer exchange period is long, several timing signals may be outputted to update air pressure data in the data holding unit 22. The aberration correction executed according to this timing signal is called the aberration correction at long time intervals. Therefore, the aberration correction at long time intervals is similar to the shot-interval correction described in the first embodiment.

When the wafer exchange is completed and exposure processing begins for a newly loaded wafer, the main control unit 60 does not output a timing signal until all the exposure processing for this wafer is completed. Therefore, while the data holding unit 22 maintains the air pressure data, correction is repeatedly performed on an aberration caused by a change in air pressure during an exposure of one wafer and in the non-exposure state, similarly to the real-time correction described in the first embodiment. This aberration correction is called the aberration correction at short time intervals.

As has been set forth above, according to the second embodiment, in a case wherein the lenses of the projection optical system are not configured with a single glass material, driving the n groups of lenses and driving the light-source wavelength, as well as the wafer stage in the optical-axis direction can correct aberrations caused by a change in air pressure. At the time of wafer exchange, n+2 aberrations can be corrected, and during a shot, as well as during a shot interval, n+1 aberrations can be corrected in real time. On the contrary, in a case wherein the lenses of the projection optical system are configured with a single glass material, driving the n groups of lenses and driving the light-source wavelength, as well as the wafer stage in the optical-axis direction, can correct aberrations caused by a change in air pressure. At the time of wafer exchange, all the aberrations can be corrected by changing the exposure-light wavelength, and during a shot, as well as during a shot interval, n+1 aberrations can be corrected in real time.

Accordingly, either the case where lenses of the projection optical system are configured with a single glass material or the case wherein the lenses are not configured with a single glass material, it is possible to correct in real time an aberration caused by a slight or sudden change in air pressure during an exposure or in the non-exposure state. As a result, it is possible to achieve an exposure apparatus capable of performing exposure with high precision.

<Third Embodiment>

Next, the third embodiment of the present invention is described. According to the third embodiment, in order to perform faster and more precise aberration correction than that of the first and second embodiments, higher speed and higher precision of the barometer which detects a change in air pressure is achieved.

Figure 4:
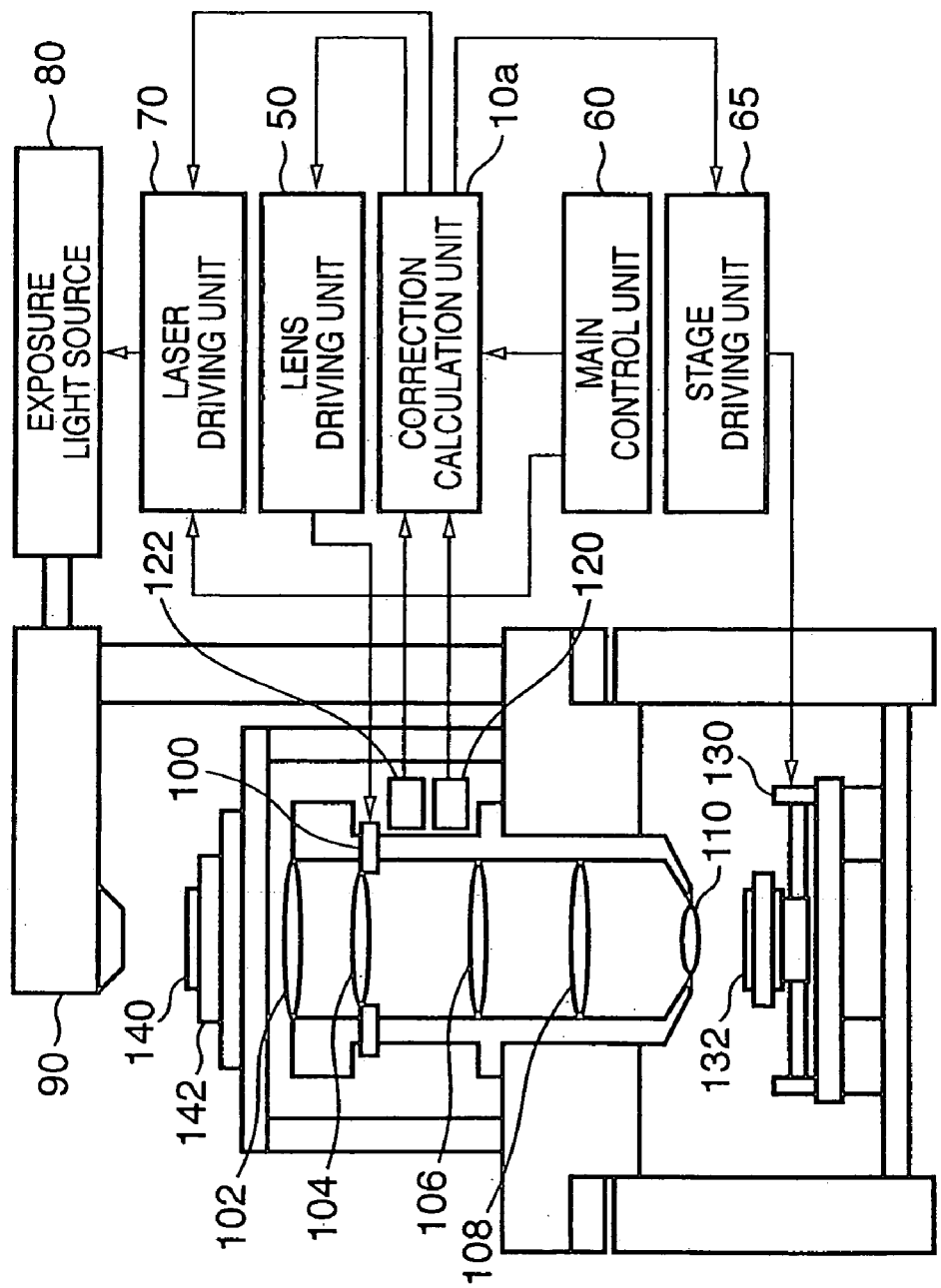
FIG. 4 is a view showing a configuration of an exposure apparatus according to a third embodiment of the present invention.

FIG. 4 shows a configuration of an exposure apparatus according to the third embodiment of the present invention. With respect to the components that perform similar operation to that of the first embodiment (FIG. 1), the same reference numerals are assigned and a description thereof is omitted. Hereinafter, the components different from the first embodiment are described.

In the third embodiment (FIG. 4), a new barometer 122 is added to the construction shown in FIG. 1, and a correction calculation unit 10a is provided. For convenience of explanation, the barometers 120 and 122 will be referred to as the first barometer and second barometer, respectively.

The first barometer 120 measures an absolute value of air pressure with high precision (a barometer having a calibration function performing calibration according to the environment). The second barometer 122 measures an absolute value or a relative value of air pressure at a higher speed than that of the first barometer. Although the first barometer for measuring an absolute value of air pressure can measure air pressure with a high precision without receiving an influence of the temperature or humidity, because it outputs an air pressure measurement value after removing an influence of the temperature or humidity, the response speed as a sensor is low. On the contrary, since the second barometer for measuring an absolute value or a relative value of air pressure performs air pressure measurement by a wavelength tracker which is configured with, e.g., a laser interferometer, the response speed is extremely high. The wavelength tracker is a measuring equipment that measures a medium, i.e., a refractive index of air, by making use of a laser beam, and outputs a refractive index of air pressure, temperature and humidity at high speed.

An output equation of the wavelength tracker employing a HeNe laser is expressed in the following manner according to Elden's formula, wherein n represents a refractive index, P [Torr] represents a pressure, T [° C.] represents a temperature, and H [%] represents a relative humidity:

$$n = 1 + a \times P \times \{1 + P \times (c - d \times T) \times 10^{-6}\}/(1 + b \times T() - e \times F \quad (9)$$

$$F = H \times f_{Sat}/100 \quad (10)$$

$$f_{Sat} = 4.07859739 + 0.44301857 \times T + 0.00232093 \times T^2 + 0.00045785 \times T^3 \quad (11)$$

$$a = 3.83639 \times 10^{-7}$$

$$b = 0.003661$$

$$c = 0.817$$

$$d = 0.0133$$

$$e = 5.607943 \times 10^{-8}$$

When the temperature T and relative humidity H are constant, the refractive index n of the output of the wavelength tracker varies according to the air pressure P. By performing reverse calculation based on the refractive index n, the air pressure P can be calculated from equation (9). Therefore, the wavelength tracker can serve as a barometer.

However, since the wavelength tracker has sensitivity to a temperature and relative humidity, when the wavelength tracker is used as a barometer, it is necessary that the environmental conditions be constant. The wavelength tracker has a barometric error of 0.34 hPa as a barometer when the temperature fluctuates by 0.01° C., and has a barometric error of 0.045 hPa as a barometer when the humidity fluctuates by 1%. Therefore, to reduce the barometric error and to achieve highly precise correction of an aberration caused by a change in air pressure, it is necessary to suppress the temperature fluctuation to at least 0.01° C. or less and to suppress the humidity fluctuation to at least 1% or less.

In general, the temperature in the interior of the exposure apparatus is controlled with the precision of approximately 0.01° C. or less for maintaining the precision of the apparatus. Since the temperature fluctuation is sufficiently small, the measurement error of the wavelength tracker caused by the temperature fluctuation can be disregarded. However, it is often the case that the humidity is not actively controlled, thus, a slight and gradual fluctuation in humidity may occur. In such a case, as is apparent from equations (9) and (10), the humidity fluctuation causes a change in the refractive index outputted from the wavelength tracker, generating a barometric error.

Furthermore, even in the case wherein the humidity fluctuation is small, the humidity shows up as an offset of the refractive index. Therefore, an accurate air pressure value cannot be obtained unless a humidity value is accurately detected and the offset of the refractive index caused by the humidity is corrected in equations (9) and (10).

In view of the above, the third embodiment comprises as the first barometer 120 a barometer which has a low response speed but detects an absolute value of air pressure without receiving an influence of the temperature or humidity, and comprises as the second barometer 122 a barometer which detects an absolute value or a relative value of air pressure at a high speed and which easily receives an influence of the temperature or humidity. By utilizing an output from the first barometer 120, which has a low response speed but can detect an absolute value of air pressure with high precision, calibration is performed on an output from the second barometer 122, which has a high response speed but is sensitive to an environmental change other than air pressure such as humidity. By virtue of this, a slight or sudden change in air pressure during an exposure or in the non-exposure state can be detected at high speed with high precision, and an aberration caused by the change in air pressure can be corrected in real time. Accordingly, it is possible to realize an exposure apparatus capable of performing exposure with high precision.

Figure 5:
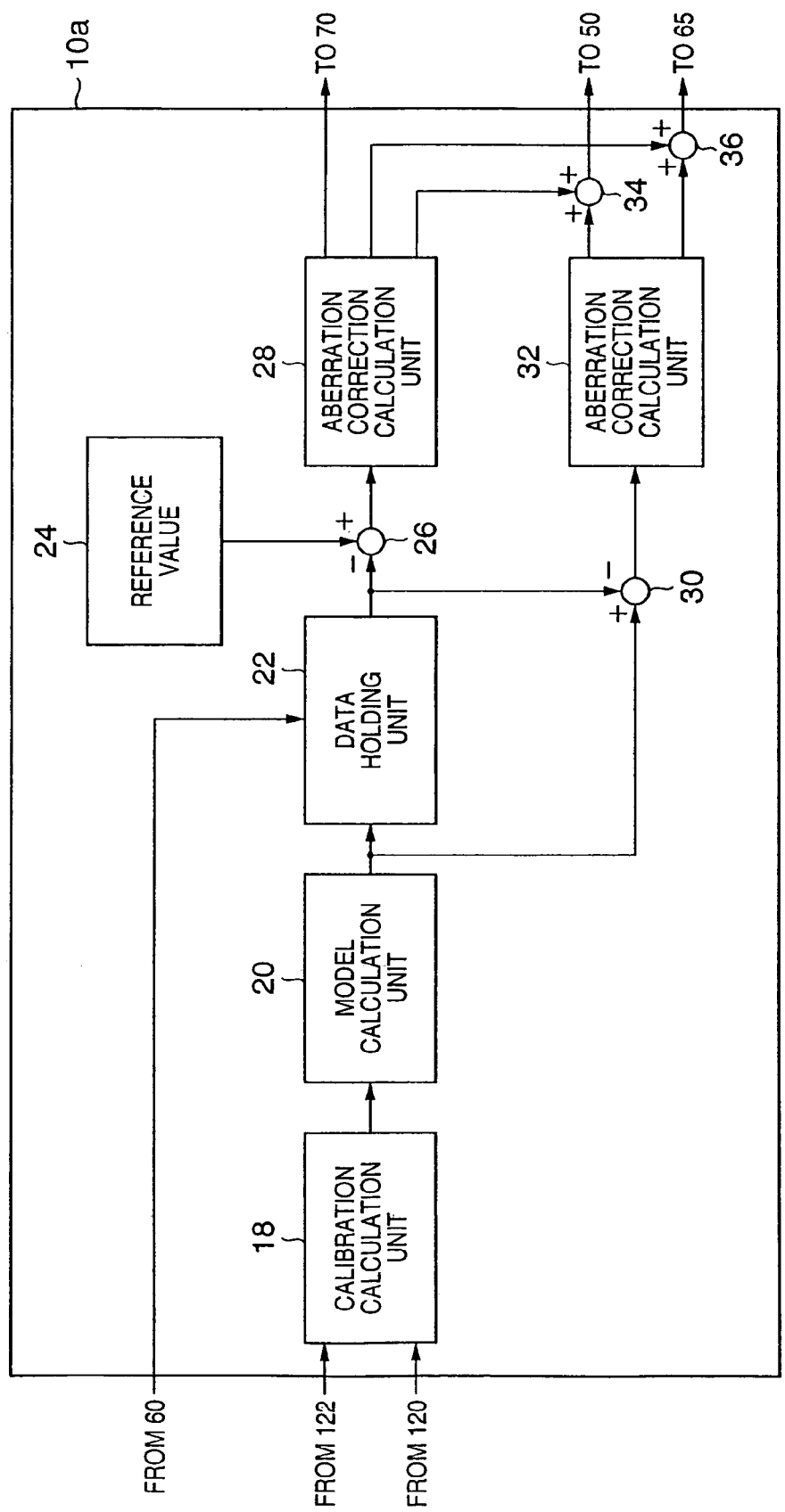
FIG. 5 is a block diagram showing, as an example, a construction of a correction calculation unit according to the third embodiment.

FIG. 5 shows a construction of the correction calculation unit 10*a* according to the third embodiment. With respect to the components that perform similar operation to the correction calculation unit 10 (FIG. 2) of the first embodiment, the same reference numerals are assigned and a description thereof is omitted. A calibration calculation unit 18 is newly added to the correction calculation unit 10*a*.

Figure 6:
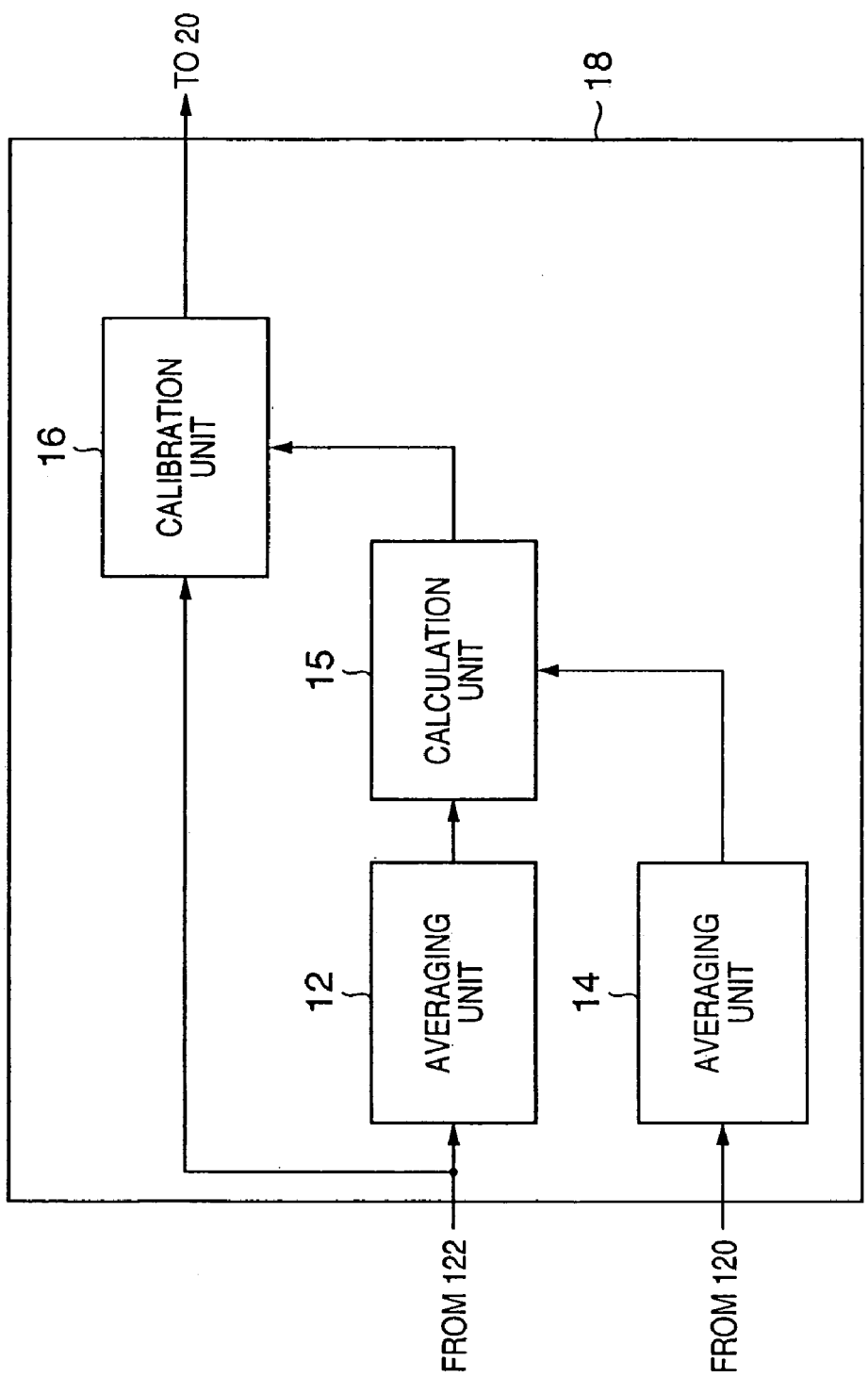
FIG. 6 is a block diagram showing, as an example, a construction of a calibration calculation unit according to the third embodiment.

An operation of the calibration calculation unit 18 is described with reference to FIG. 6. An output of the first barometer 120 is inputted to an averaging unit 14, while an output of the second barometer 122 is inputted to an averaging unit 12. Respective air pressure is data averaged by the averaging units 12 and 14, and the averaged data is inputted to a calculation unit 15. The calculation unit 15 calculates an offset of the output data of the averaging unit 12 outputted from the second barometer 122, based on the output data of the averaging unit 14 outputted from the first barometer 120. More specifically, the calculation unit 15 calculates a difference between the data from the averaging unit 14 and the data from the averaging unit 12. The offset calculated by the calculation unit 15 is inputted to a calibration unit 16. The calibration unit 16 performs calibration on the air pressure data transmitted moment to moment, i.e., in real time, from the second barometer 122 based on the offset signal outputted by the calculation unit 15, and outputs the calibrated data as accurate air pressure data to the model calculation unit 20.

The averaging time of the averaging units 12 and 14 may range from tens of seconds to several minutes or from tens of minutes to several hours. For instance, if there is a possibility that the humidity fluctuates within several minutes to tens of minutes, respective air pressure data are averaged while exposure processing is performed for one wafer and an offset is calculated by the calculation unit 15 while the wafer is exchanged to update the value. Then, in the wafer exposure processing, the updated offset is used to calibrate the data from the second barometer 122. In this manner, each time one wafer is processed, an offset value serving as calibration data can be calculated and updated by the calculation unit 15 for calibration of the data outputted by the second barometer 122. If the humidity fluctuation is small, averaging processing is performed for approximately several minutes by the averaging units 12 and 14 when a reticle is exchanged or when the exposure apparatus is started. Then, an offset is calculated by the calculation unit 15 to update and maintain the value, and the calibration unit 16 performs calibration on the data from the second barometer 122.

As described above, the calibration calculation unit 18 employs the data outputted by the first barometer 120, which has a low response speed but can measure an absolute value of air pressure with high precision, to perform calibration on the data outputted by the second barometer 122, which has a high response speed, but causes a barometric error due to humidity fluctuation, or the like. As a result, air pressure data can be obtained with high precision at a high response speed. The constructions of the model calculation unit 20 and other components shown in FIG. 5 are similar to those of the first embodiment and second embodiment.

Accordingly, based on the air pressure data obtained at high speed with high precision by the calibration calculation unit 18, an aberration caused by a change in air pressure can be corrected with high precision during a shot interval or in real time as described in the first embodiment. Alternatively, aberration correction can be executed at short time intervals and long time intervals as described in the second embodiment.

For instance, by applying the aberration correction method described in the first embodiment to the third embodiment, in a case wherein the lenses of the projection optical system are not configured with a single glass material, n+2 aberrations caused by a change in air pressure can be corrected during a shot interval by driving the n groups of lenses and driving the light-source wavelength, as well as the wafer stage in the optical-axis direction, and n+1 aberrations can be corrected in real time during a shot by driving the n groups of lenses and driving the wafer stage in the optical-axis direction. In a case wherein the lenses of the projection optical system are configured with a single glass material, all aberrations caused by a change in air pressure can be corrected during a shot interval by driving the exposure-light wavelength, and n+1 aberrations can be corrected in real time during a shot by driving the n groups of lenses and driving the wafer stage in the optical-axis direction.

In particular, by virtue of the air pressure measurement according to the third embodiment, a slight or sudden change in air pressure during an exposure or in the non-exposure state can be detected at high speed with high precision, because the output from the first barometer 120, which has a low response speed, but can detect an absolute value of air pressure with high precision is employed to perform calibration on the absolute value or a relative value of air pressure outputted by the second barometer 122, which has a high response speed but is sensitive to an environmental change other than air pressure, such as humidity. Accordingly, either the case where lenses of the projection optical system are configured with a single glass material or the case where the lenses are not configured with a single glass material, it is possible to correct in real time an aberration caused by a slight or sudden change in air pressure during an exposure or in the non-exposure state.

Note that, as described above, it goes without saying that the aberration correction method of the second embodiment is applicable to the third embodiment. In this case, the apparatus is constructed such that an aberration is corrected by driving the lens and driving the wafer stage in the optical-axis direction at short time intervals, and that an aberration is corrected by changing the exposure-light wavelength or by driving the lens and changing the exposure-light wavelength at long time intervals. Herein, the short time interval may be of an interval of the correction executed during an exposure or in the non-exposure state of wafer exposure processing. The long time interval may be of an interval of the correction executed in the non-exposure state when wafer exchange processing is performed.

<Fourth Embodiment>

Next, the fourth embodiment is described. The fourth embodiment describes an aberration correction performed in a case wherein the lenses of the projection optical system are configured with a single glass material or the lenses have a characteristic that can be regarded as being a single glass material. Therefore, in the fourth embodiment, all aberrations are always corrected in real time by changing the wavelength of a laser beam.

Figure 7:
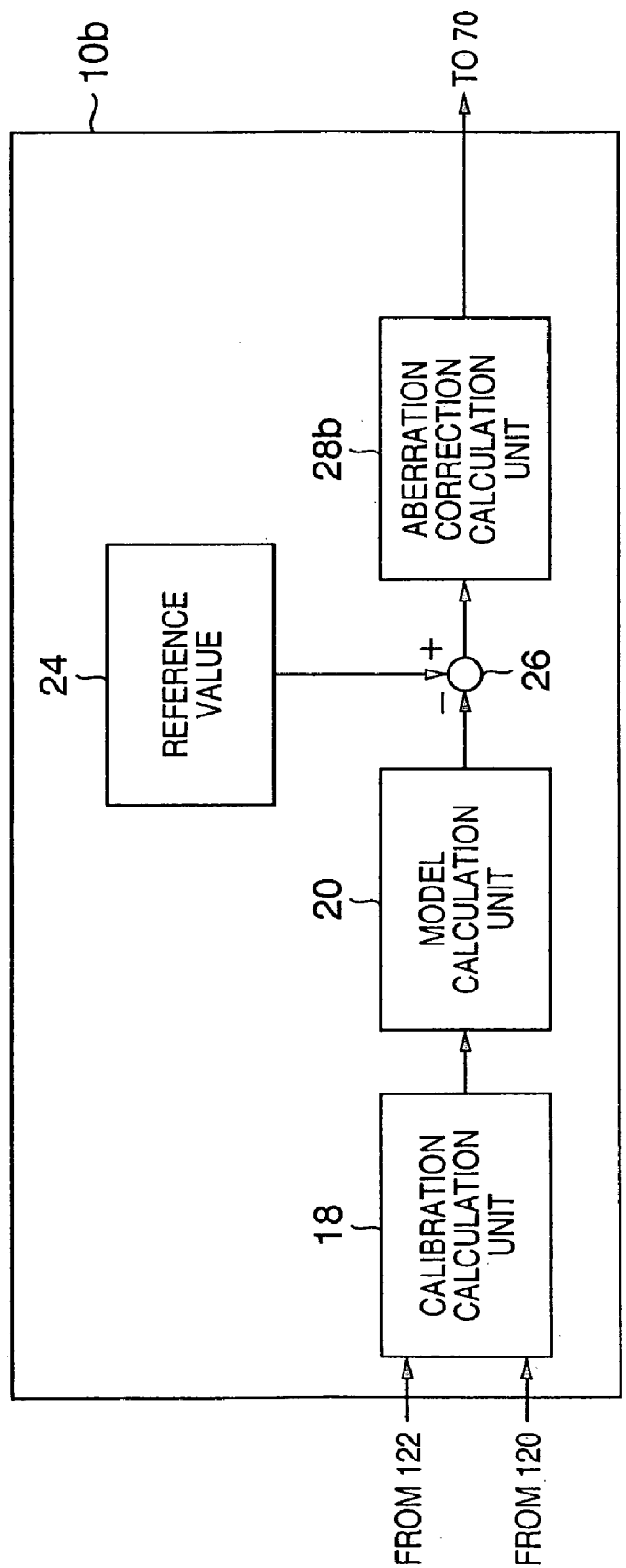
FIG. 7 is a block diagram showing, as an example, a construction of a correction calculation unit according to a fourth embodiment of the present invention.

FIG. 7 shows a construction of a correction calculation unit 10b according to the fourth embodiment. In the correction calculation unit according to the fourth embodiment, the data holding unit 22, adder-subtracter 30, and aberration correction calculation unit 32 are excluded from the correction calculation unit 10 of the third embodiment (FIG. 5). The aberration correction calculation unit 28b, which is similar to the aberration correction calculation unit 28, only outputs a wavelength changing signal to the laser driving unit 70.

The lenses of the projection optical system 101 according to the fourth embodiment are configured with a single glass material or have a characteristic that can be regarded as being a single glass material. Because the lenses can be regarded as being a single glass material, it is possible to correct all aberrations caused by a change in air pressure by changing the wavelength of exposure light.

The data from the second barometer 122 transmitted in real time is calibrated by the calibration calculation unit 18 based on the data from the first barometer 120, and the calibrated data is subjected to predetermined modeling calculation in the model calculation unit 20 as necessary. The output value is compared with the air pressure reference value 24, and a difference is calculated by the adder-subtracter 26. The aberration correction calculation unit 28b calculates a wavelength changing amount using an exposure-light-wavelength changing amount characteristic equation calculating a change in the air pressure measurement value (output of the model calculation unit 20) from the reference air pressure (reference value 24). The calculated wavelength changing amount is inputted to the laser driving unit 70. In accordance with the wavelength changing amount, the laser driving unit 70 changes the wavelength of the exposure light source 80 using the wavelength selecting element driving mechanism 88. In this manner, an aberration caused by air pressure is corrected. In this case, real time correction is performed only for changing the wavelength of exposure light, and it is not necessary to drive the lens or wafer stage in the optical-axis direction.

As has been set forth above, according to the fourth embodiment, in a case wherein the lenses of the projection optical system are configured with a single glass material, an aberration caused by a change in air pressure is corrected during a shot interval as well as in real time by changing a wavelength of exposure light. Particularly, by utilizing an output from the first barometer 120, which has a low response speed but can detect an absolute value of air pressure with high precision, calibration is performed on an output from the second barometer 122 (an absolute value or a relative value of air pressure), which has a high response speed, but is sensitive to an environmental change other than air pressure, such as humidity. By virtue of this, a slight or sudden change in air pressure during an exposure or in the non-exposure state can be detected at high speed with high precision. Accordingly, it is possible to realize an exposure apparatus capable of correcting in real time an aberration caused by a change in air pressure and performing exposure with high precision.

<Fifth Embodiment>

Next, the fifth embodiment of the present invention is described. The fifth embodiment describes a case wherein the lenses of the projection optical system are not configured with a single glass material.

Figure 8:
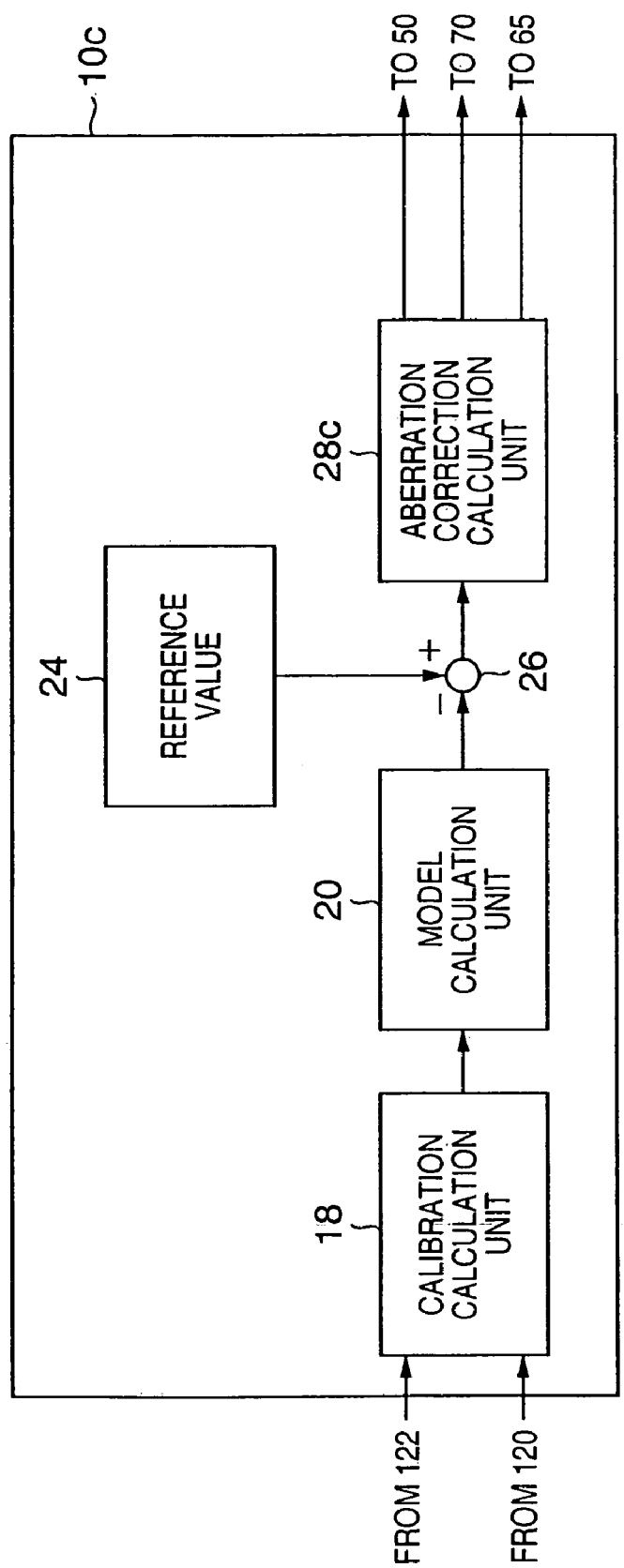
FIG. 8 is a block diagram showing, as an example, a construction of a correction calculation unit according to a fifth embodiment of the present invention.

FIG. 8 shows a construction of a correction calculation unit 10c according to the fifth embodiment. The correction calculation unit according to the fifth embodiment has an aberration correction calculation unit 28c in place of the aberration correction calculation unit 28b in the correction calculation unit 10b of the fourth embodiment (FIG. 7). The aberration correction calculation unit 28c, which is similar to the aberration correction calculation unit 28, outputs a lens driving signal to the lens driving unit, outputs a wafer stage driving signal to the lens driving unit, outputs a wafer stage driving signal in the optical-axis direction to the stage driving unit 65, and outputs a wavelength changing signal to the laser driving unit 70 for correcting an aberration caused by a change in air pressure.

The lenses of the projection optical system according to the fifth embodiment are not configured with a single glass material. Therefore, based on air pressure difference data transmitted in real time from the adder-subtracter 26, the aberration correction calculation unit 28c predicts an aberration caused by a change in air pressure using equation (1), and calculates by equation (4) a lens driving amount and an exposure-light-wavelength changing amount necessary for correcting the aberration. The calculated lens driving amount is outputted to the lens driving unit 50, and the lens is displaced with respect to the optical-axis direction using the lens driving mechanism unit, thereby correcting the aberration caused by the change in air pressure. The calculated exposure-light-wavelength changing amount is inputted to the laser driving unit 70, and the wavelength is changed by the wavelength selecting element driving mechanism 88 of the exposure light source 80, thereby correcting the aberration caused by the change in air pressure.

Note that focus can be corrected by driving the wafer stage 130 in the optical-axis direction. Correction using the wafer stage 130 is realized in the following manner. First, a focus error caused by a change in air pressure, as well as a focus error caused by the aforementioned lens driving or wavelength change, are calculated separately by the aberration correction calculation unit 28c to obtain the wafer stage driving amount for focus correction. The wafer stage driving amount is outputted to the stage driving unit 65. The stage driving unit 65 displaces the wafer stage 130 with respect to the optical-axis direction, thereby correcting the focus. Aberration correction executed by driving the wafer stage in the optical-axis direction in addition to the aforementioned aberration correction (n+1 aberration corrections) executed by driving n groups of lenses and changing the exposure-light wavelength can realize correction of n+2 aberrations.

The aberration correction calculation unit 28c according to the fifth embodiment calculates, regardless of whether it is during an exposure or in the non-exposure state, a lens driving amount and an exposure-light-wavelength changing amount (as well as the wafer stage driving amount in the optical-axis direction) necessary for correcting an aberration constantly caused by a change in air pressure. Particularly, by utilizing an output from the first barometer 120, which has a low response speed, but can detect an absolute value of air pressure with high precision, calibration is performed on an output from the second barometer 122 (an absolute value or a relative value of air pressure), which has a high response speed, but is sensitive to an environmental change other than air pressure, such as humidity. By virtue of this, a slight or sudden change in air pressure during an exposure or in the non-exposure state can be detected at high speed with high precision. Accordingly, it is possible to realize an exposure apparatus capable of correcting in real time an aberration caused by a change in air pressure and performing exposure with high precision.

<Application to a Semiconductor Manufacturing Apparatus>

Described next is an embodiment of a semiconductor device manufacturing method employing the above-described exposure apparatus. FIG. 10 shows a production flow of producing micro devices (e.g., semiconductor chips such as ICs or LSIs, liquid crystal panels, CCDs, thin-film magnetic heads, micro machines, and so forth).

In step S101 (circuit design), a circuit of a semiconductor device is designed. In step S102 (mask production), a mask on which the designed circuit pattern is formed is produced. Meanwhile, in step S103 (wafer production), a wafer is produced with a material such as silicon. In step S104 (wafer process), which is called a pre-process, an actual circuit is formed on the wafer by a lithography technique using the mask and wafer prepared as described above. In step S105 (assembly), which is called a post-process, a semiconductor chip is manufactured using the wafer produced in step S104. Step S105 includes an assembling process (dicing, bonding), a packaging process (chip embedding), and so on. In step S106 (inspection), the semiconductor device manufactured in step S105 is subjected to inspection such as an operation-check test, a durability test, and so on. The semiconductor device manufactured in the foregoing processes is shipped (step S107).

Figure 11:
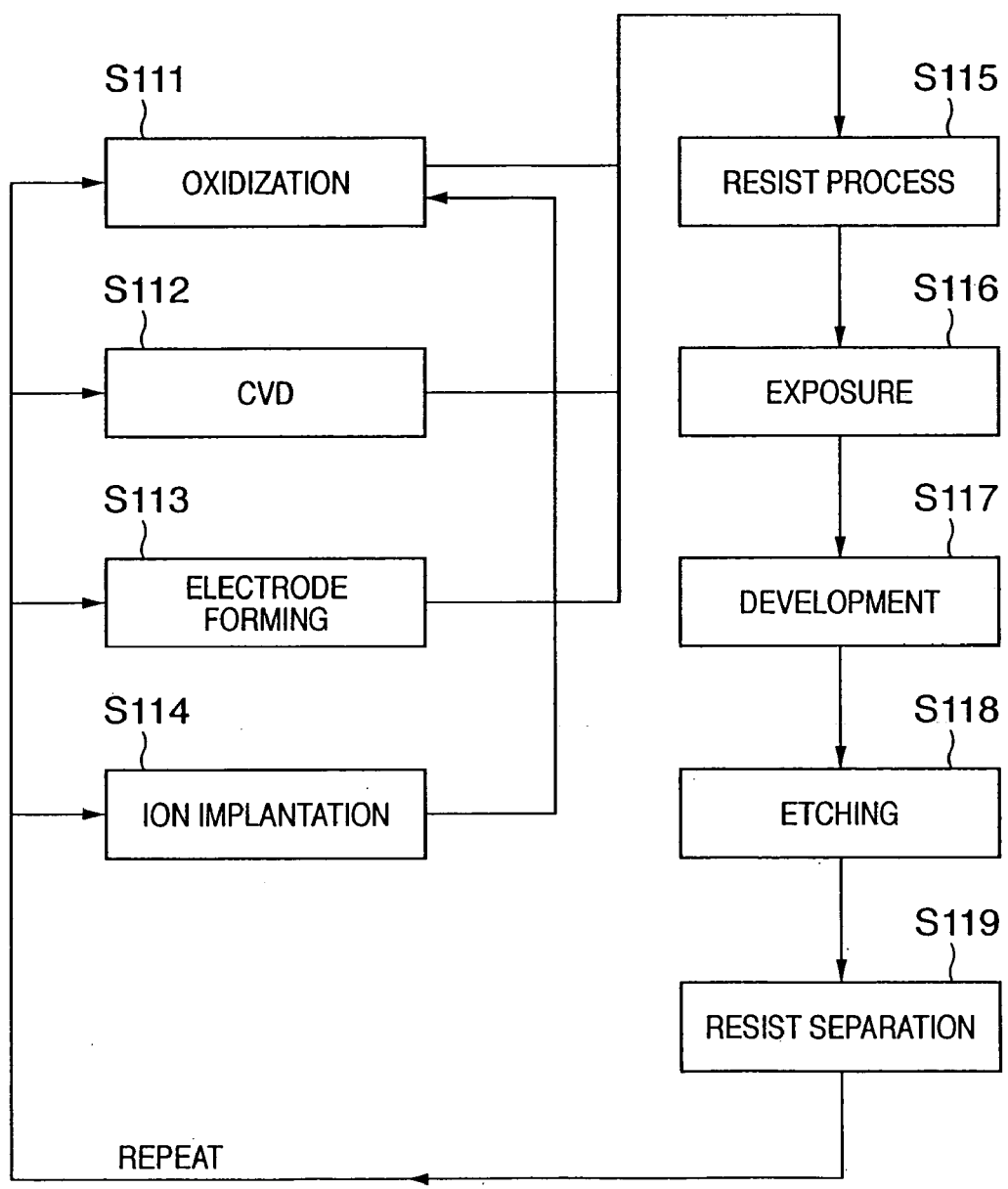
FIG. 11 is a flowchart describing in detail a wafer process.

FIG. 11 shows a flow of the aforementioned wafer process in detail. In step S111 (oxidization), the wafer surface is oxidized. In step S112 (CVD), an insulating film is deposited on the wafer surface. In step S113 (electrode forming), electrodes are deposited on the wafer. In step S114 (ion implantation), ions are implanted on the wafer. In step S115 (resist process), a photosensitive agent is coated on the wafer. In step S116 (exposure), the circuit pattern of the mask is exposed on the wafer by the above-described exposure apparatus. In step S117 (development), the exposed wafer is developed. In step S118 (etching), portions other than the developed resist image are removed. In step S119 (resist separation), unnecessary resist after the etching process is removed. By repeating the foregoing steps, multiple circuit patterns are formed on the wafer.

As has been set forth above, according to the present invention, it is possible to correct an aberration of an optical system caused by a slight or sudden change in air pressure and perform exposure processing with high precision.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus for exposing a wafer to light through a pattern of a mask, said apparatus comprising:
   a light source configured to generate the light;
   a projection optical system configured to project the pattern onto the wafer;
   a barometer configured to measure pressure of an atmosphere in said apparatus;
   a lens driving unit configured to drive a lens included in said projection optical system;
   a wavelength changing unit configured to change a wavelength of the light; and
   an instruction unit configured to instruct said lens driving unit to drive said lens in an exposure state of said apparatus based on a signal output by said barometer, configured to instruct said wavelength changing unit to change the wavelength only in a non-exposure state of said apparatus based on the signal, and configured to instruct said lens driving unit to initialize a position of said lens in association with the change of the wavelength.

2. An apparatus according to claim 1, wherein the number of aberrations of said projection optical system corrected by said instruction unit in the non-exposure state is more than that in the exposure state.

3. An apparatus according to claim 1, wherein said instruction unit is configured to instruct said lens driving unit to drive said lens in both of the exposure state and the non-exposure state.

4. An apparatus according to claim 1, further comprising a stage configured to hold the wafer and to move, wherein said instruction unit is configured to instruct said stage to move in the exposure state based on the signal.

5. An exposure method of exposing a wafer to light through a pattern of a mask using an exposure apparatus, the exposure apparatus including a projection optical system configured to project the pattern onto a wafer, a barometer configured to measure pressure of an atmosphere in the apparatus, a lens driving unit configured to drive a lens in the projection optical system, and a wavelength changing unit configured to change a wavelength of the light, said method comprising:
   a first instruction step of instructing the lens driving unit to drive the lens in an exposure state of the apparatus based on a signal output by the barometer;
   a second instruction step of instructing the wavelength changing unit to change the wavelength only in a non-exposure state of the apparatus based on a signal output by the barometer; and
   a third instruction step of instructing the lens driving unit to reset a position of said lens in association with the change of the wavelength.

* * * * *

UNITED STATES PATENT AND TRADEMARK OFFICE
CERTIFICATE OF CORRECTION

PATENT NO. : 7,164,464 B2 Page 1 of 1
APPLICATION NO. : 11/201426
DATED : January 16, 2007
INVENTOR(S) : Yoshiyuki Okada It is certified that error appears in the above-identified patent and that said Letters Patent is hereby corrected as shown below:

ON THE TITLE PAGE:
In item "(57) ABSTRACT," line 1, "includes" should read -- including --.

COLUMN 8:
Line 51, "$\Delta L^2_{RT}$," should read -- $\Delta L2_{RT}$ --.

COLUMN 12:
Line 8, "$n=1+a\times P\times[\{1+P\times(c-d\times T)\times10^{-6}\}/(1+b\times T(]-e\times F$" should read
-- $n=1+a\times P\times[\{1+P\times(c-d\times T)\times10^{-6}\}/(1+b\times T)]-e\times F$ --.

Signed and Sealed this

Fourteenth Day of August, 2007

JON W. DUDAS
*Director of the United States Patent and Trademark Office*